(12) United States Patent
Ing et al.

(10) Patent No.: US 10,217,693 B1
(45) Date of Patent: Feb. 26, 2019

(54) METHODS AND SYSTEMS FOR HIGH VOLTAGE COMPONENT COOLING IN ELECTRIC VEHICLE FOR FAST CHARGE

(71) Applicant: NIO USA, Inc., San Jose, CA (US)

(72) Inventors: Adam H. Ing, Santa Clara, CA (US); Alexander J. Smith, White Lake, MI (US); Rick Rajaie, Rochester Hills, MI (US)

(73) Assignee: NIO USA, Inc., San Jose, CA (US)

( * ) Notice: Subject to any disclaimer, the term of this patent is extended or adjusted under 35 U.S.C. 154(b) by 0 days.

(21) Appl. No.: 15/689,766

(22) Filed: Aug. 29, 2017

(51) Int. Cl.
| | |
|---|---|
| *H01R 12/00* | (2006.01) |
| *H01L 23/427* | (2006.01) |
| *H01L 23/38* | (2006.01) |
| *B60R 16/03* | (2006.01) |

(52) U.S. Cl.
CPC .......... *H01L 23/4275* (2013.01); *B60R 16/03* (2013.01); *H01L 23/38* (2013.01)

(58) Field of Classification Search
CPC . H01L 23/4275; H01L 23/38; H01R 13/6666; H01R 13/713; H01R 23/7068; H01R 4/2429; H01R 9/2441; B60R 16/03
USPC ........................................... 439/620.08, 76.2
See application file for complete search history.

(56) References Cited

U.S. PATENT DOCUMENTS

| | | | | |
|---|---|---|---|---|
| 3,268,720 A | * | 8/1966 | Meckler ................. | F21V 29/00 362/294 |
| 3,402,322 A | * | 9/1968 | Meckler ................. | F21V 29/00 250/338.1 |
| 5,640,069 A | * | 6/1997 | Nilssen ............. | H02M 7/53832 315/209 R |
| 6,368,119 B2 | * | 4/2002 | Murakami ............ | H01R 9/226 439/76.1 |
| 6,443,748 B1 | * | 9/2002 | Yuasa ................... | H05K 5/069 439/205 |
| 6,448,882 B1 | * | 9/2002 | Inaba ................... | H01H 85/044 337/159 |
| 6,478,585 B2 | * | 11/2002 | Yuasa ................. | H01R 9/2458 439/732 |
| 6,494,723 B2 | * | 12/2002 | Yamane ............. | B60R 16/0238 439/404 |
| 6,506,061 B2 | * | 1/2003 | Yuasa ................... | H02G 3/088 174/72 B |
| 6,603,283 B2 | * | 8/2003 | Yuasa ................. | H01R 9/2425 320/104 |
| 6,629,850 B2 | * | 10/2003 | Kato ..................... | H01R 9/226 439/732 |
| 6,650,087 B2 | * | 11/2003 | Yuasa .................. | H01R 9/226 320/107 |

(Continued)

FOREIGN PATENT DOCUMENTS

CN          106252787          12/2016

OTHER PUBLICATIONS

U.S. Appl. No. 15/689,557, filed Aug. 29, 2017, Ing et al.

(Continued)

*Primary Examiner* — Abdullah Riyami
*Assistant Examiner* — Vladimir Imas
(74) *Attorney, Agent, or Firm* — Sheridan Ross P.C.

(57) ABSTRACT

Methods and systems are disclosed for controlling heat within a junction box. The disclosure relates to the use of phase change materials to manage heat generation in a junction box of a vehicle.

20 Claims, 7 Drawing Sheets

(56) References Cited

U.S. PATENT DOCUMENTS

| | | | | |
|---|---|---|---|---|
| 6,795,226 B2* | 9/2004 | Agrawal | B32B 17/10036 | 359/254 |
| 6,990,999 B2* | 1/2006 | Patel | F15B 13/0814 | 137/596.16 |
| 7,104,845 B2* | 9/2006 | Higuchi | H01H 85/044 | 439/620.26 |
| 7,160,118 B2* | 1/2007 | Shirota | B60R 16/0238 | 439/76.2 |
| 7,358,292 B2* | 4/2008 | Miyoshi | C08L 53/00 | 361/819 |
| 7,613,003 B2* | 11/2009 | Pavlovic | B60L 3/0069 | 361/709 |
| 7,767,905 B2* | 8/2010 | Meyer | H02G 3/123 | 174/135 |
| 7,859,219 B2* | 12/2010 | Harris | B60L 11/1818 | 320/104 |
| 7,914,300 B2* | 3/2011 | Akahori | B60R 16/0238 | 439/76.2 |
| 8,058,842 B2* | 11/2011 | Kai | B60L 11/1861 | 320/116 |
| 8,142,235 B2* | 3/2012 | Lietz | H01R 9/245 | 439/723 |
| 8,207,704 B2* | 6/2012 | Kai | B60L 11/1861 | 320/116 |
| 8,226,446 B2* | 7/2012 | Kondo | H01R 4/34 | 439/488 |
| 8,264,204 B2* | 9/2012 | Nagaoka | B60L 11/1855 | 320/116 |
| 8,471,670 B2* | 6/2013 | Matsumoto | H01H 85/0417 | 29/623 |
| 8,852,773 B2* | 10/2014 | Yoon | H01M 2/36 | 429/121 |
| 8,968,913 B2* | 3/2015 | Rosskamp | H01M 2/202 | 429/159 |
| 8,977,117 B2* | 3/2015 | Kreutzman | H05B 3/82 | 29/890.031 |
| 9,003,649 B1 | 4/2015 | Romero et al. | | |
| 9,027,360 B2 | 5/2015 | Chainer et al. | | |
| 9,041,403 B2* | 5/2015 | Aoki | H01M 10/482 | 324/426 |
| 9,077,019 B2* | 7/2015 | Kosaki | H01G 9/155 | |
| 9,145,099 B2* | 9/2015 | Komiya | B60R 16/0238 | |
| 9,312,530 B2* | 4/2016 | Ogasawara | H01M 2/1077 | |
| 9,748,619 B2* | 8/2017 | Iida | H01M 10/625 | |
| 9,873,394 B2* | 1/2018 | Hachiya | B60R 16/03 | |
| 2017/0125866 A1 | 5/2017 | Zhou et al. | | |

OTHER PUBLICATIONS

"Q-CHILL™ Coldplates, High Performance Liquid Cooling," MaxQ Technology, 2016, retrieved from http://maxqtechnology.com/coldplates/, 7 pages.

"SAB0606-W—6 In×6 In Water Cooled, Optical Breadboard," Base Lab Tools, 2016, retrieved from https://web.archive.org/web/20160313154114/http://maxqtechnology.com/coldplates/, 2 pages.

* cited by examiner

METHODS AND SYSTEMS FOR HIGH VOLTAGE COMPONENT COOLING IN ELECTRIC VEHICLE FOR FAST CHARGE

FIELD

The present disclosure is generally directed to vehicle body construction, in particular, toward systems and methods of using phase change material for high voltage component cooling in electric vehicle for fast charge.

BACKGROUND

Traditional passenger electric vehicles generally do not generate much heat when being driven around due to a lower average current. As the current is relatively low, the generated heat can be dissipated to the air via natural convection. Fast charging standards are increasing the amount of sustained current on all high voltage components. These fast charging currents generate significantly more heat than typical driving usage.

Currently, components such as contactors typically use connected busbars to draw away the heat. This heat is then released via natural convection. It is common, however, for junction boxes to have more than one contactor. This compounds the problem as more heat is being generated in smaller spaces.

SUMMARY

It is with respect to the above issues and other problems that the embodiments presented herein were contemplated. The shortcomings of traditional methods of cooling contactors, relays, and other components of a vehicle may be solved using one or more of the embodiments described herein.

As disclosed herein, a method for passively capturing heat in a junction box may be implemented using a phase change material.

The heat control processes discussed herein may be performed in a number of ways. In some embodiments, a PCM may be used to pack a junction box comprising contactors/relays and bus bars. In some embodiments, packs of PCM may be used to line the interior of a junction box. In some embodiments, a thermoelectric device ("TED") or thermoelectric cooler ("TEC") may be used in combination with the PCM to further control the heat within a junction box.

A phase change material ("PCM") may be one or more substances with a high heat of fusion and capable of storing and releasing large amounts of energy. A PCM may be capable of melting and solidifying at a specific temperature or temperature range, referred to herein as a PC temperature (i.e. its melting temperature). A PCM may have an internal temperature which may rise as it absorbs heat. At a lower temperature relative to a PCM's PC temperature, the PCM may be in a solid form. As the PCM continues to absorb heat it may reach its PC temperature. Upon reaching the PC temperature, the PCM may then continue to absorb heat without a significant rise in temperature. This absorption of heat may continue until all of the PCM has transformed to a liquid phase.

The PCM temperature may depend on the type of PCM being used. A PCM may be selected based on an estimated temperature range within a junction box during a normal fast charging scenario.

In some embodiments, an organic PCM such as paraffin carbohydrate and lipid derived materials may be used. In other embodiments, an inorganic PCM such as a salt hydrate may be used. In other embodiments, eutectics and/or hygroscopic materials may be used. In other embodiments, a number of various types of PCMs may be used together.

PCM may be in the form of a flexible plastic container filled with a PCM or in some embodiments PCM may applied to components without being contained. For example, a location to be heat-controlled, such as a junction box, may be physically flooded or filled with an amount of PCM. In some embodiments, a number of plastic bags full of PCM may be packed into a junction box or other location to be heat-controlled.

Phase change material ("PCM") may be used to capture excess transient heat via phase change (melting); it has no cooling benefits once steady state has been achieved and the PCM is completely liquefied. The amount of PCM may be sized to take the transient excess heat from fast charging. The PCM phase change temperature may be tuned such that it will only be activated during fast charge (i.e. ~85° C.).

The PCM may be one or more of: (1) embedded into the support structure for manufacturability; or (2) used a "filler" in the junction box.

Many advantages may be achieved by using an efficient method of cooling the relays as disclosed herein. For example, relays may be downsized for continuous current (200 A forever), as compared to transient case like DC fast charge (350 A for 15 minutes). Also, busbars may also be downsized. The need for active cooling, i.e., liquid coldplates/fans, may be eliminated. The need for discrete heat sink may also be eliminated as PCM can transfer heat directly to chassis which will in turn cool the PCM. The solutions disclosed herein essentially provide a cost-free heat sink. Using systems as disclosed herein, heat may be transferred directly to the chassis (passively).

A junction box may comprise a bus bar and one or more relays or contactors. The bus bar may have a first terminal portion operable to connect to a charging port and a second terminal portion operable to connect to one or more of a current sensor and a battery. The internal elements (e.g., the bus bar and relays) may be protected by a case making up the outer portion of the junction box. The charging port terminal and the current sensor and/or battery terminal may be in walls of the case allowing for external connections to the charger, battery, and/or current sensor. The external ports may comprise a gasket or other weather sealing element to provide moisture and dust resistance. The junction box may allow for power to run to and from the battery and/or a battery pack. In some embodiments, a battery may be charged by the transfer of high-voltage DC running from the charging port through the current sensor to the battery via the junction box.

The relays or contactors and the busbar during periods of charging may become increasingly hot in temperature. In order to avoid overheating, large elements are typically required. The present disclosure, however, allows for a passive temperature control, keeping the internal temperature of the junction box at a reasonable level. By avoiding high heats, smaller components may be used.

As disclosed herein, a junction box may be filled with one or more PCMs. The phase change material may be in contact with the busbars, and also encapsulating the relays. The busbars, may generate heat. The maximum temperature is around 150, and then they start to melt the PCM they're contacting with on the relays. The relays may have a similar max temperature. One function of the PCM may be to draw heat away from the busbars and relays so the relays and busbars may be downsized. This should lead to a cheaper solution as such high currents may only be seen in the transient.

In some embodiments, the charging port may be of the SAE J1772 (IED Type 1) standard. The charger could either be a part outside the vehicle or inside the vehicle. In some embodiments, the charger is an external charger. During a DC fast charge, the charger may charge the battery directly with DC power, thus without converting AC to DC. In some embodiments, PCM may be placed inside the shelf, structural support and/or chassis. The shelf that the relays are mounted to inside the junction box may be covered with PCM. And then the heat will sink into the shelf (or chassis), which is likely made out of aluminum, which is very thermally conductive, and it should dissipate the heat into the phase change material.

A wide variety of phase change materials may be used. Different PCMs change phase at different temperatures and have capabilities to absorb different amounts of heat. In some embodiments, a PCM may be chosen such that it would change phase around 40 or 50 degrees C. The reason for this is during normal operation, components may not be expected to be running at a temperature higher than that. Only during these transient PC fast charge scenarios will higher temperatures be seen.

By using PCM, both the relays and the busbar may be downsized and any need for upsizing any components of the vehicle may be avoided. In terms of copper, a bus bar may comprise 90 to 100 millimeters squared of copper without the use of PCM and with the use of PCM, the bus bar may be reduced down to about 70 millimeters. The numbers used herein are used as examples and in practical uses the bus bar may be larger or smaller than these numbers. Also, coppers are expensive for packaging perspective. By using less copper and smaller bus bars, packaging space and weight may be reduced. Finally, the relays may be downsized. For example, the downsize may be from relays that are capable of continuously handling 325 amps to relays classed for 275 amps. Such relays may also be lighter and cheaper.

In some embodiments, there will be no active elements in the cooling. In some embodiments, temperature sensors may be placed on each of the relays to determine what temperature the relays are at during operation. For example, if the relays are starting abnormally hot, then the charge can be slowed down to prevent overheating.

The phrases "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together. When each one of A, B, and C in the above expressions refers to an element, such as X, Y, and Z, or class of elements, such as $X_1$-$X_n$, $Y_1$-$Y_m$, and $Z_1$-$Z_o$, the phrase is intended to refer to a single element selected from X, Y, and Z, a combination of elements selected from the same class (e.g., $X_1$ and $X_2$) as well as a combination of elements selected from two or more classes (e.g., $Y_1$ and $Z_0$).

The term "a" or "an" entity refers to one or more of that entity. As such, the terms "a" (or "an"), "one or more" and "at least one" can be used interchangeably herein. It is also to be noted that the terms "comprising", "including", and "having" can be used interchangeably.

The terms "determine," "calculate," and "compute," and variations thereof, as used herein, are used interchangeably and include any type of methodology, process, mathematical operation, or technique.

The term "means" as used herein shall be given its broadest possible interpretation in accordance with 35 U.S.C., Section 112, Paragraph 6. Accordingly, a claim incorporating the term "means" shall cover all structures, materials, or acts set forth herein, and all of the equivalents thereof. Further, the structures, materials or acts and the equivalents thereof shall include all those described in the summary of the invention, brief description of the drawings, detailed description, abstract, and claims themselves.

The term "module" as used herein refers to any known or later developed hardware, software, firmware, artificial intelligence, fuzzy logic, or combination of hardware and software that is capable of performing the functionality associated with that element.

It should be understood that every maximum numerical limitation given throughout this disclosure is deemed to include each and every lower numerical limitation as an alternative, as if such lower numerical limitations were expressly written herein. Every minimum numerical limitation given throughout this disclosure is deemed to include each and every higher numerical limitation as an alternative, as if such higher numerical limitations were expressly written herein. Every numerical range given throughout this disclosure is deemed to include each and every narrower numerical range that falls within such broader numerical range, as if such narrower numerical ranges were all expressly written herein.

The preceding is a simplified summary of the disclosure to provide an understanding of some aspects of the disclosure. This summary is neither an extensive nor exhaustive overview of the disclosure and its various aspects, embodiments, and configurations. It is intended neither to identify key or critical elements of the disclosure nor to delineate the scope of the disclosure but to present selected concepts of the disclosure in a simplified form as an introduction to the more detailed description presented below. As will be appreciated, other aspects, embodiments, and configurations of the disclosure are possible utilizing, alone or in combination, one or more of the features set forth above or described in detail below.

BRIEF DESCRIPTION OF THE DRAWINGS

The accompanying drawings are incorporated into and form a part of the specification to illustrate several examples of the present disclosure. These drawings, together with the description, explain the principles of the disclosure. The drawings simply illustrate preferred and alternative examples of how the disclosure can be made and used and are not to be construed as limiting the disclosure to only the illustrated and described examples. Further features and advantages will become apparent from the following, more detailed, description of the various aspects, embodiments, and configurations of the disclosure, as illustrated by the drawings referenced below.

DETAILED DESCRIPTION

Before any embodiments of the disclosure are explained in detail, it is to be understood that the disclosure is not limited in its application to the details of construction and the arrangement of components set forth in the following description or illustrated in the following drawings. The disclosure is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items.

Figure 1A:
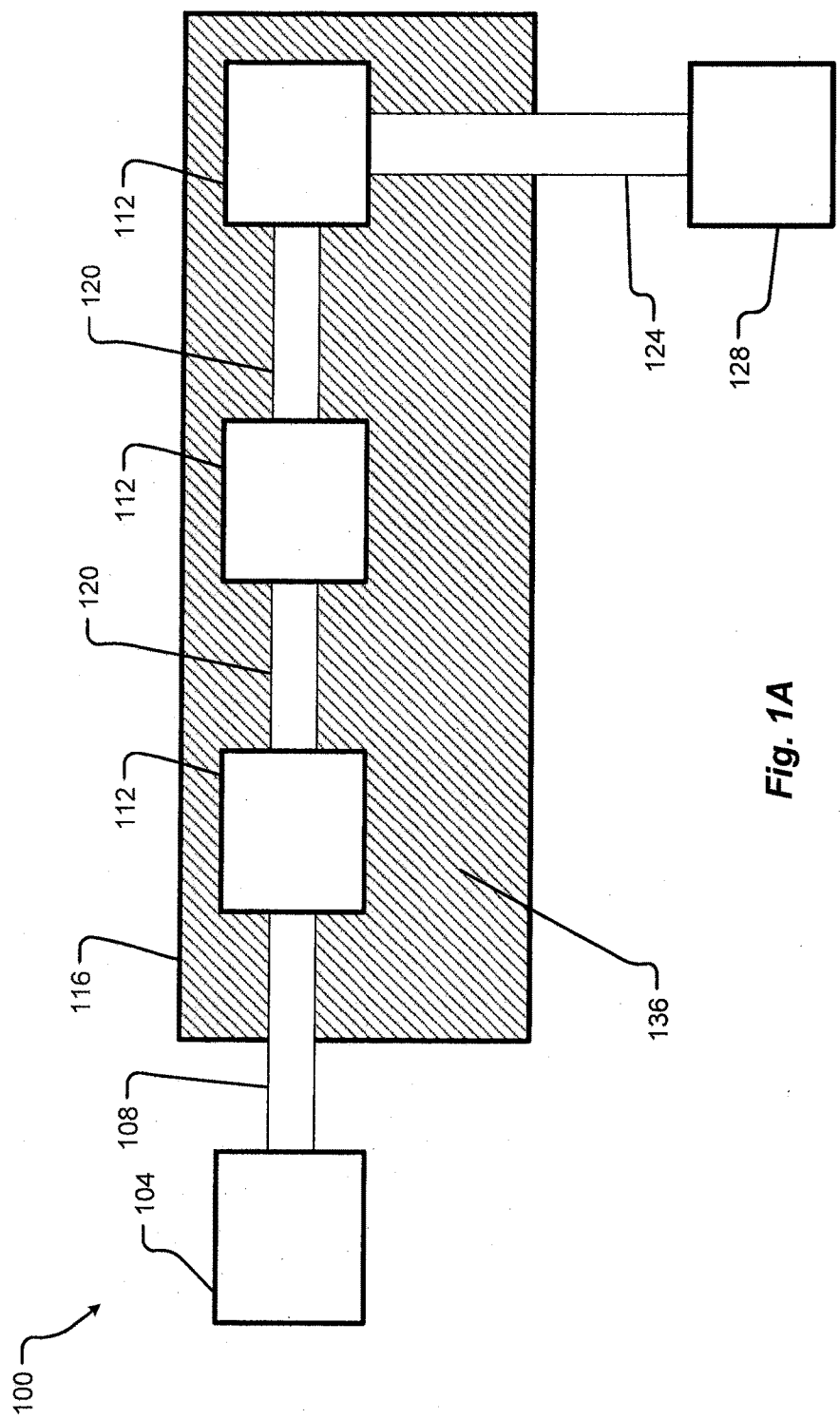
FIG. 1A is a block diagram of a junction box in accordance with embodiments of the present disclosure.

As illustrated in FIG. 1A, a system 100 for controlling heat in a junction box 116 may comprise filling the junction box 116 with one or more PCMs 136. The PCM 136 may be contained in a number of malleable plastic bags. In other embodiments, the PCM 136 may simply be placed in the junction box 116 without plastic bags or other containers, essentially flooding the junction box 116 with PCM 136.

The system 100 may comprise a charger 104 connected to a relay 112 in the junction box 116 via a terminal 108 or bus bar or other means of connection. The junction box 116 may comprise one or more relays 112 and a bus bar 120 connecting the one or more relays 112. A current sensor 128 may be connected to a relay 112 via a terminal 124, or bus bar or other means of connection.

Figure 1B:
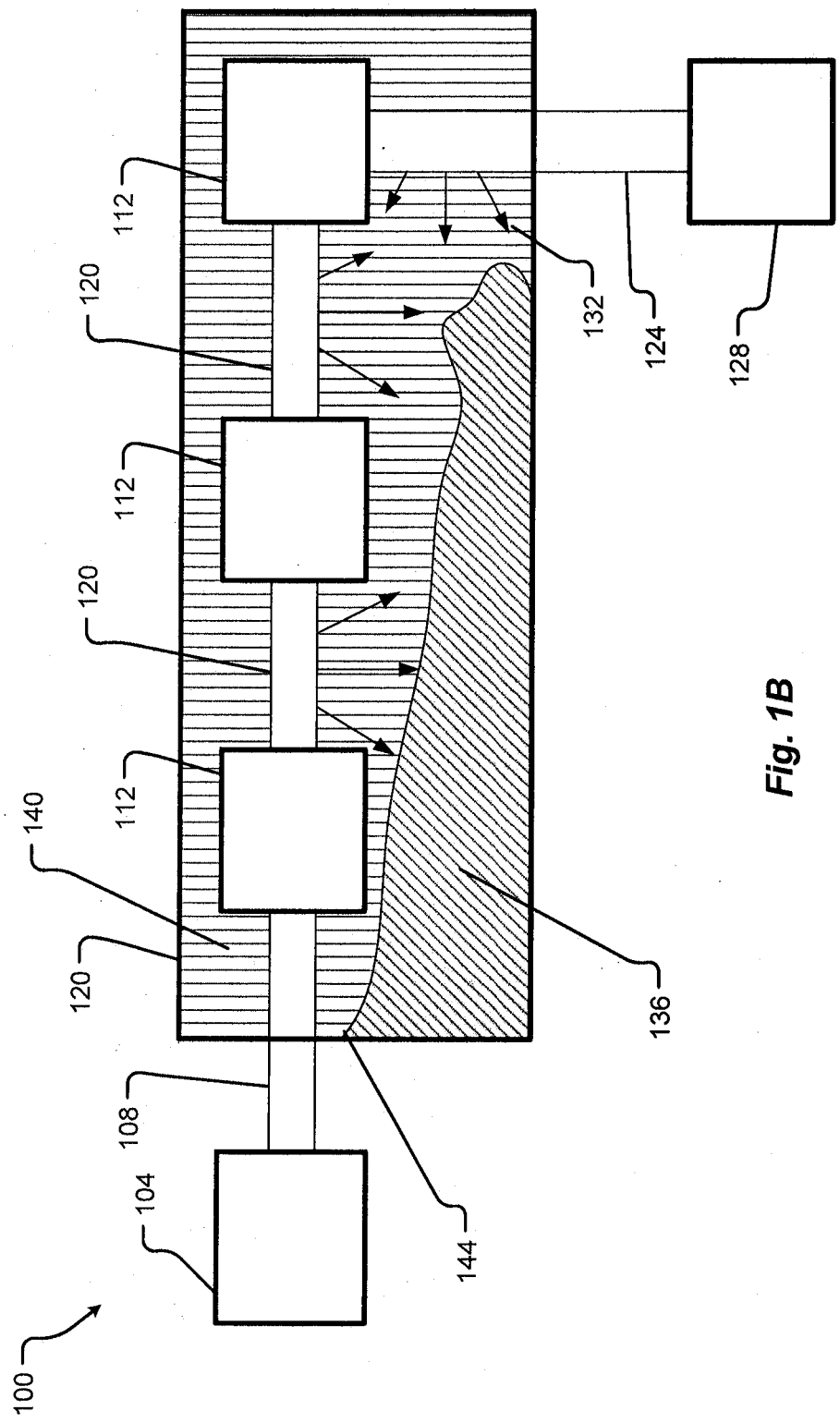
FIG. 1B is an illustration of a junction box with phase change material in accordance with embodiments of the present disclosure.

During charging, or other times of operation, elements within a junction box 116 may heat and rise in temperature. As illustrated in FIG. 1B, as elements such as the relays 112 and bus bar 120 heat up, the elements may put off heat as indicated by the arrows 132. The PCM 136 may turn to a liquid phase 140 upon reaching a melting temperature. A line 144 between the liquid phase 140 of the PCM 136 and the solid phase of the PCM 136 may occur. As the elements within the junction box continue to rise in temperature and put off heat, the PCM 136 may continue to change to liquid 140 until the entire PCM 136 has changed phase.

Figure 2:
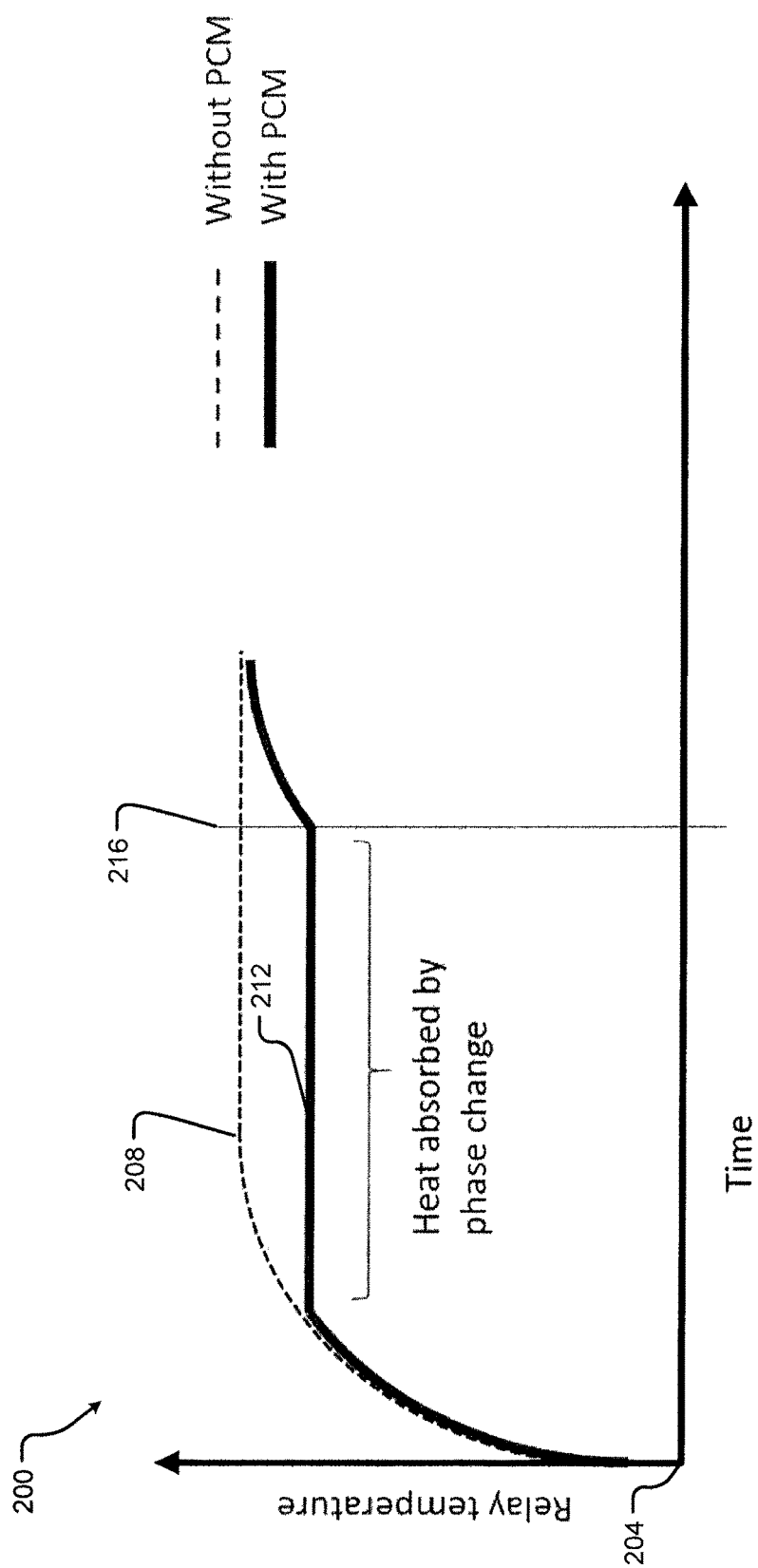
FIG. 2 is a graph in accordance with embodiments of the present disclosure.

At the beginning of a charging, the temperature of relays and other elements within the junction box may be at a low level 204 as indicated in the graph 200 of FIG. 2. Without PCM in the junction box, the relays may reach an excessively high temperature 208 at an early time during the charge. With PCM in the junction box, however, the relays may be held at a lesser temperature 212 for a period of time during the phase change of the PCM until a moment 216 of time at which the PCM has totally changed phase. In some embodiments, the amount of PCM used in the junction box may be such that the moment 216 of time at which the PCM has totally changed phase is near or after the moment of time at which a typical fast charge has completed. In this way, the relays may never reach a temperature as high as that of a junction box without PCM.

Figure 3:
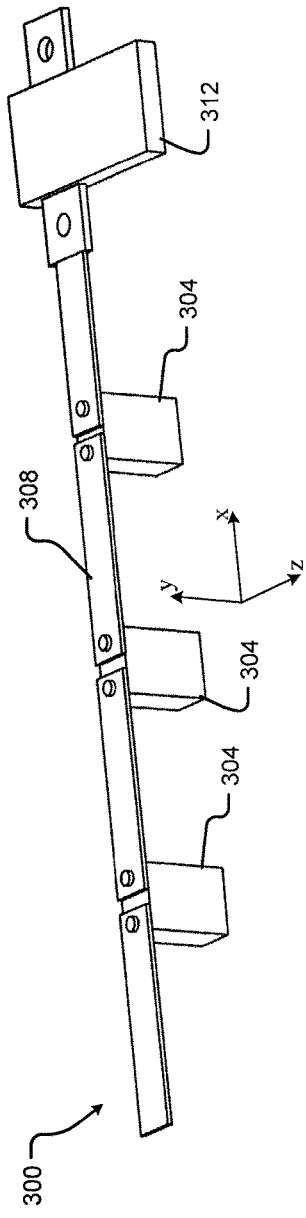
FIG. 3 is an illustration of a junction box in accordance with embodiments of the present disclosure.
Figure 4:
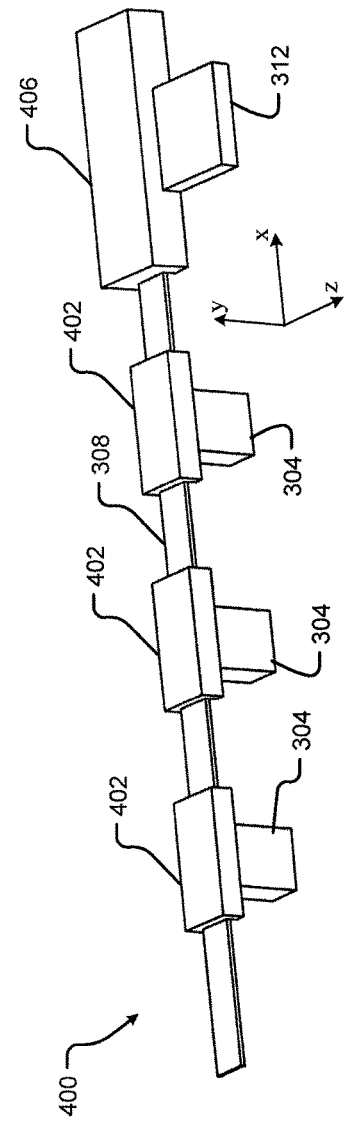
FIG. 4 is an illustration of a junction box with phase change material in accordance with embodiments of the present disclosure.

A typical junction box 300 may comprise one or more busbars 308 connecting one or more relays 304 and a current sensor 312 as illustrated in FIG. 3. As illustrated in FIG. 4, a junction box 400 may comprise one or more busbars 308 connecting one or more relays 304 and a current sensor 312. In some embodiments, the junction box 400 may further comprise one or more contactor PCMs 402 and a PCM 406 on or near the current sensor 312. As discussed herein, the PCMs 402, 406 may be separate PCM units in plastic containers. In some embodiments, a junction box case containing one or more relays and busbars may be flooded with PCM material.

Figure 5A:
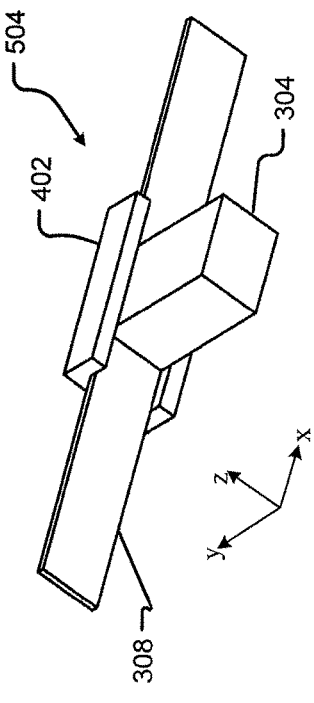
FIG. 5A is an illustration of a junction box with phase change material in accordance with embodiments of the present disclosure.
Figure 5B:
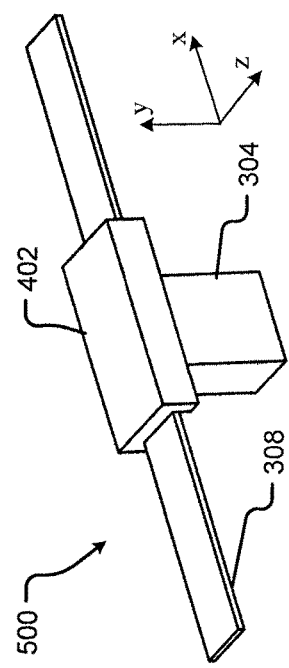
FIG. 5B is an illustration of a junction box with phase change material in accordance with embodiments of the present disclosure.
Figure 5D:
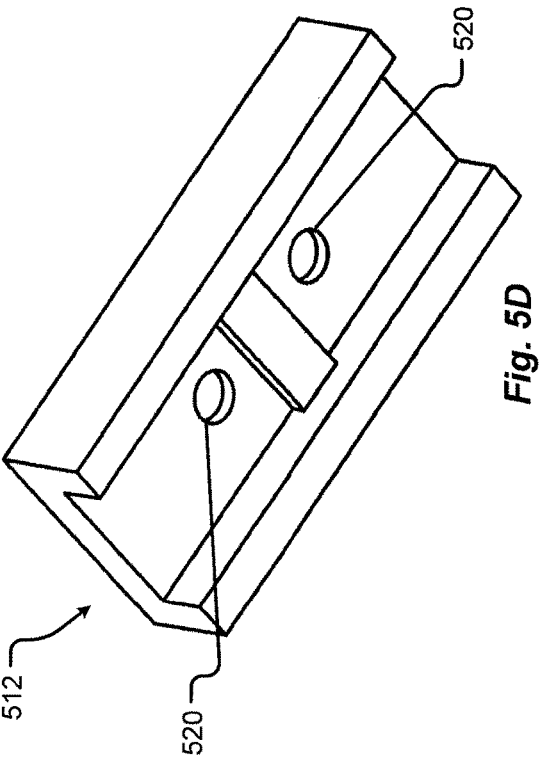
FIG. 5D is an illustration of a shell for phase change material in accordance with embodiments of the present disclosure.
Figure 5C:
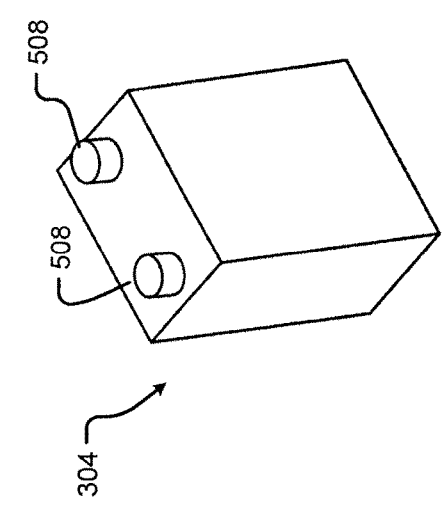
FIG. 5C is an illustration of a relay in accordance with embodiments of the present disclosure.

As illustrated in the closeup perspective view 500 of FIG. 5A, a PCM 402 may cover a busbar 308 and a relay 304. A bottom view 504 is illustrated in FIG. 5B. As can be appreciated, the PCM 402 may cover the top portion of the relay and extend downward over the edges of the bus bar 308. A relay 304 as used in the systems discussed herein may be as illustrated in FIG. 5C. A relay 304 may comprise one or more contact points 508 which may extrude from the top portion of the relay 304 and make contact with a bus bar of a junction box. As illustrated in FIG. 5D, a PCM shell 512 may be custom fit to a contactor or relay. The outer shell 512 may be filled with PCM. The PCM shell 512 may have indentations 520 capable of fitting over contact points of a relay as well as separations in a bus bar. The PCM shell 512 may comprise a trough shape form fitted to a bus bar and relays.

Figure 6A:
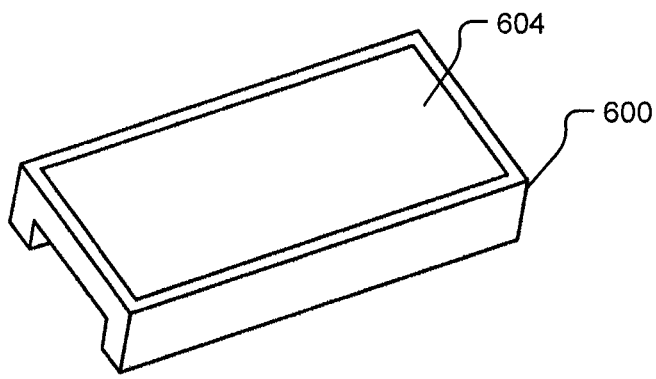
FIG. 6A is an illustration of a shell for phase change material in accordance with embodiments of the present disclosure.
Figure 6B:
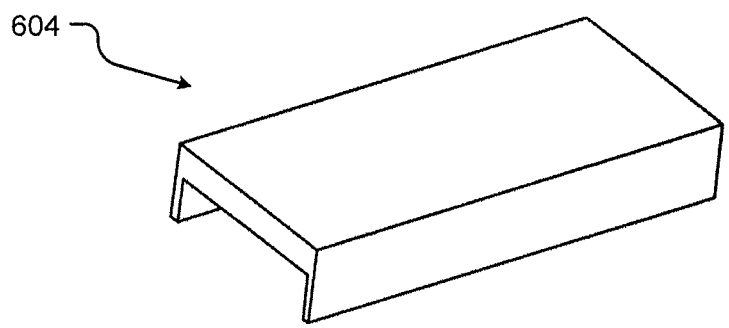
FIG. 6B is an illustration of a phase change material in accordance with embodiments of the present disclosure.
Figure 6C:
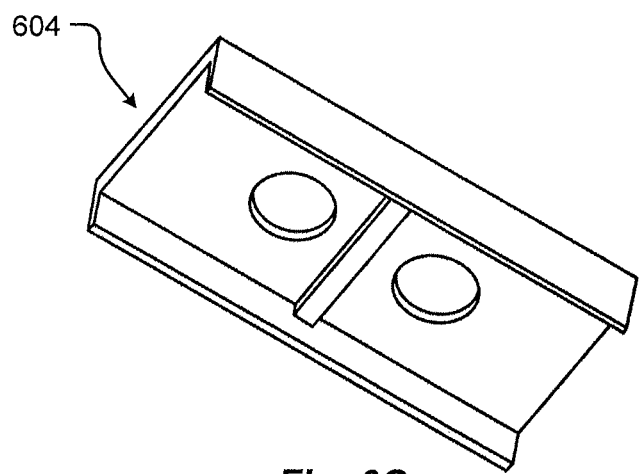
FIG. 6C is an illustration of a phase change material in accordance with embodiments of the present disclosure.

A PCM shell 604 may be as illustrated in FIG. 6A. In some embodiments, the PCM shell 600 may comprise a PCM 604 filling the shell 600. While no upper layer is shown in FIG. 6A, the top of the shell 600 may be covered, protecting the PCM 604 from spilling out of the shell 600. The shell 600 may in general be hollow, allowing for the PCM 604 to take the general shape of the shell 600 as illustrated in FIGS. 6B and 6C. The PCM 604, being malleable, may when in liquid phase fill up the shell 600 and take the form. For illustration purposes, the PCM 604 alone is illustrated in FIGS. 6B and 6C in which it can be appreciated that the PCM 604 may take the same shape as the shell 600.

Figure 7:
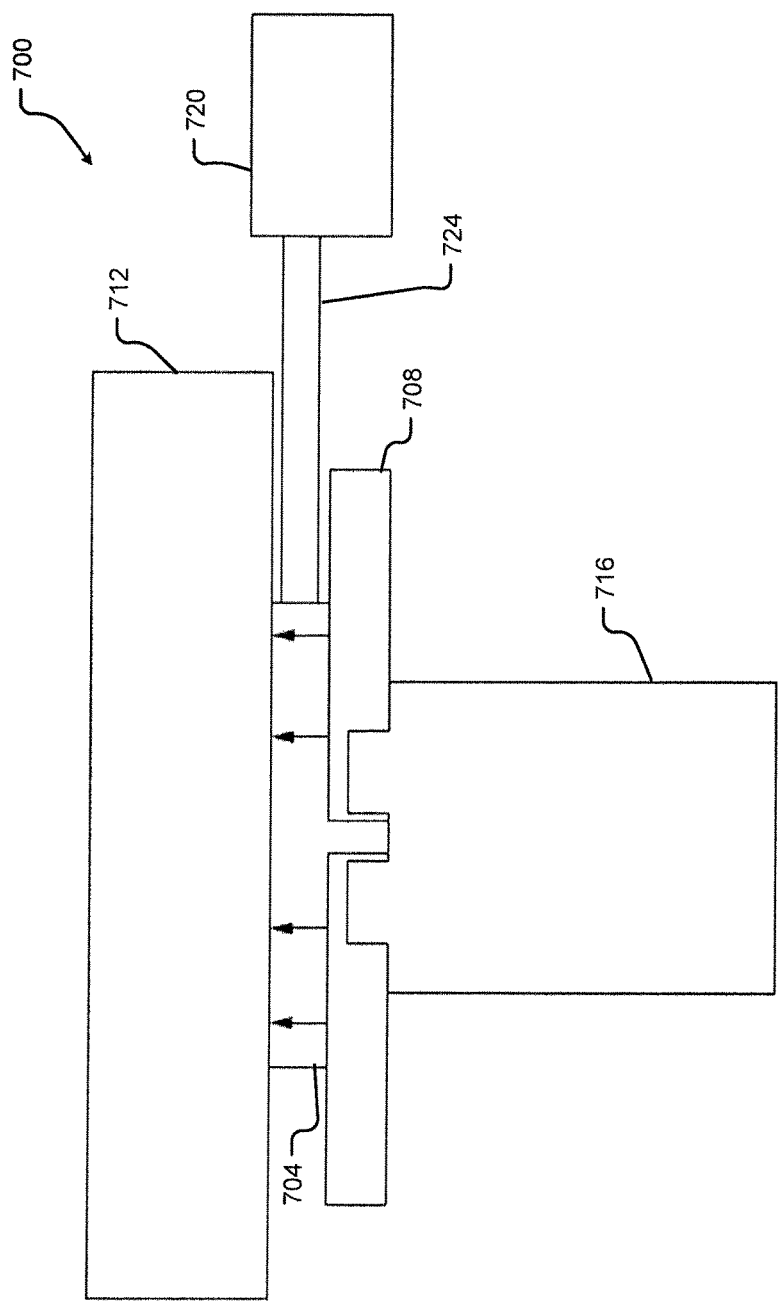
FIG. 7 is an illustration of a junction box heat control system in accordance with embodiments of the present disclosure.

As illustrated in FIG. 7, in some embodiments a system 700 of controlling heat within a junction box may comprise using a thermoelectric device ("TED") 704 between heat generating elements (e.g. a contactor 716 and a bus bar 708) and a PCM 712. A power supply 720 may apply voltage via a connection 724. The TED 704 may comprise a thermoelectric material such as bismuth telluride or other thermoelectric material. The TED 704 may, through the Peltier effect, operate as a cooling mechanism, wherein heat from the heat-generating element (e.g. contactor 716 and bus bar 708) of the junction box may be transferred to the PCM 712.

The TED 704 may be connected to the power supply 720 which may apply a voltage across the TED 704 resulting in a temperature difference between the PCM 712 side of the TED 704 and the bus bar 708 side of the TED 704.

Any of the steps, functions, and operations discussed herein can be performed continuously and automatically.

The exemplary systems and methods of this disclosure have been described in relation to the figures. However, to avoid unnecessarily obscuring the present disclosure, the preceding description omits a number of known structures and devices. This omission is not to be construed as a limitation of the scope of the claimed disclosure. Specific details are set forth to provide an understanding of the present disclosure. It should, however, be appreciated that the present disclosure may be practiced in a variety of ways beyond the specific detail set forth herein.

While the flowcharts have been discussed and illustrated in relation to a particular sequence of events, it should be appreciated that changes, additions, and omissions to this sequence can occur without materially affecting the operation of the disclosed embodiments, configuration, and aspects.

A number of variations and modifications of the disclosure can be used. It would be possible to provide for some features of the disclosure without providing others.

In yet another embodiment, the systems and methods of this disclosure can be implemented in conjunction with a special purpose computer, a programmed microprocessor or microcontroller and peripheral integrated circuit element(s), an ASIC or other integrated circuit, a digital signal processor, a hard-wired electronic or logic circuit such as discrete element circuit, a programmable logic device or gate array such as PLD, PLA, FPGA, PAL, special purpose computer, any comparable means, or the like. In general, any device(s) or means capable of implementing the methodology illustrated herein can be used to implement the various aspects of this disclosure. Exemplary hardware that can be used for the present disclosure includes computers, handheld devices, telephones (e.g., cellular, Internet enabled, digital, analog, hybrids, and others), and other hardware known in the art. Some of these devices include processors (e.g., a single or multiple microprocessors), memory, nonvolatile storage, input devices, and output devices. Furthermore, alternative software implementations including, but not limited to, distributed processing or component/object distributed processing, parallel processing, or virtual machine processing can also be constructed to implement the methods described herein.

In yet another embodiment, the disclosed methods may be readily implemented in conjunction with software using object or object-oriented software development environments that provide portable source code that can be used on a variety of computer or workstation platforms. Alternatively, the disclosed system may be implemented partially or fully in hardware using standard logic circuits or VLSI design. Whether software or hardware is used to implement the systems in accordance with this disclosure is dependent on the speed and/or efficiency requirements of the system, the particular function, and the particular software or hardware systems or microprocessor or microcomputer systems being utilized.

In yet another embodiment, the disclosed methods may be partially implemented in software that can be stored on a storage medium, executed on programmed general-purpose computer with the cooperation of a controller and memory, a special purpose computer, a microprocessor, or the like. In these instances, the systems and methods of this disclosure can be implemented as a program embedded on a personal computer such as an applet, JAVA® or CGI script, as a resource residing on a server or computer workstation, as a routine embedded in a dedicated measurement system, system component, or the like. The system can also be implemented by physically incorporating the system and/or method into a software and/or hardware system.

Although the present disclosure describes components and functions implemented in the embodiments with reference to particular standards and protocols, the disclosure is not limited to such standards and protocols. Other similar standards and protocols not mentioned herein are in existence and are considered to be included in the present disclosure. Moreover, the standards and protocols mentioned herein and other similar standards and protocols not mentioned herein are periodically superseded by faster or more effective equivalents having essentially the same functions. Such replacement standards and protocols having the same functions are considered equivalents included in the present disclosure.

The present disclosure, in various embodiments, configurations, and aspects, includes components, methods, processes, systems and/or apparatus substantially as depicted and described herein, including various embodiments, subcombinations, and subsets thereof. Those of skill in the art will understand how to make and use the systems and methods disclosed herein after understanding the present disclosure. The present disclosure, in various embodiments, configurations, and aspects, includes providing devices and processes in the absence of items not depicted and/or described herein or in various embodiments, configurations, or aspects hereof, including in the absence of such items as may have been used in previous devices or processes, e.g., for improving performance, achieving ease, and/or reducing cost of implementation.

The foregoing discussion of the disclosure has been presented for purposes of illustration and description. The foregoing is not intended to limit the disclosure to the form or forms disclosed herein. In the foregoing Detailed Description for example, various features of the disclosure are grouped together in one or more embodiments, configurations, or aspects for the purpose of streamlining the disclosure. The features of the embodiments, configurations, or aspects of the disclosure may be combined in alternate embodiments, configurations, or aspects other than those discussed above. This method of disclosure is not to be interpreted as reflecting an intention that the claimed disclosure requires more features than are expressly recited in each claim. Rather, as the following claims reflect, inventive aspects lie in less than all features of a single foregoing disclosed embodiment, configuration, or aspect. Thus, the following claims are hereby incorporated into this Detailed Description, with each claim standing on its own as a separate preferred embodiment of the disclosure.

Moreover, though the description of the disclosure has included description of one or more embodiments, configurations, or aspects and certain variations and modifications, other variations, combinations, and modifications are within the scope of the disclosure, e.g., as may be within the skill and knowledge of those in the art, after understanding the present disclosure. It is intended to obtain rights, which include alternative embodiments, configurations, or aspects to the extent permitted, including alternate, interchangeable and/or equivalent structures, functions, ranges, or steps to those claimed, whether or not such alternate, interchangeable and/or equivalent structures, functions, ranges, or steps are disclosed herein, and without intending to publicly dedicate any patentable subject matter.

Embodiments include a junction box of a vehicle, the junction box comprising: one or more relays; one or more bus bars connected to one or more of the one or more relays; one or more terminals that interconnect with a battery of the vehicle and one of the one or more relays; and one or more phase change materials attached to at least one of the relays, bus bars, and/or terminals, wherein the one or more phase change materials limit heat generation during a charging of a battery of the vehicle.

Aspects of the above junction box include the junction box further comprising a thermoelectric device.

Aspects of the above junction box include wherein the junction box is flooded with the one or more phase change materials.

Aspects of the above junction box include wherein each one of one or more malleable plastic containers contains a separate one of the one or more phase change materials.

Aspects of the above junction box include wherein a first terminal of the one or more terminals connects to a current sensor.

Aspects of the above junction box include wherein the one or more phase change materials have a melting temperature, wherein the melting temperature corresponds to a maximum temperature of the one or more relays.

Aspects of the above junction box include wherein a first phase change material of the one or more phase change materials is comprised within a shell.

Aspects of the above junction box include wherein the shell is shaped to fit one or more contacts of a first relay of the one or more relays.

Aspects of the above junction box include wherein the first phase change material comprises a form similar to a form of the shell.

Aspects of the above junction box include wherein the shell is shaped to fit two contacts of a first relay of the one or more relays and portions of two bus bars of the one or more bus bars.

Aspects of the above junction box include wherein the one or more phase change materials comprise an amount corresponding to a duration of the charging of the vehicle.

Aspects of the above junction box include wherein the junction box further comprises a current sensor.

Aspects of the above junction box include wherein each one of the one or more relays is associated with a separate one of the one or more phase change materials.

Embodiments include a process of preparing a heat-control system for controlling heat of a junction box during charging, the process comprising the steps of: providing a shell, wherein the shell is formed to make contact with one or more bus bars and one or more contacts of a relay; filling the shell with one or more phase change materials; and fitting the shell onto one or more of the one or more bus bars and/or the one or more contacts of the relay, wherein the one or more phase change materials limit heat generation during a charging of a battery of the vehicle.

Aspects of the above process include further comprising providing a thermoelectric device.

Aspects of the above process include wherein the one or more phase change materials have a melting temperature, wherein the melting temperature corresponds to a maximum temperature of the relay.

Aspects of the above process include wherein the one or more phase change materials comprise a form similar to a form of the shell.

Aspects of the above process include wherein the shell is shaped to fit the one or more contacts of the relay and portions of two bus bars of the one or more bus bars.

Aspects of the above process include wherein the one or more phase change materials comprise an amount corresponding to a duration of a charging of the vehicle.

Embodiments include a heat management device, the device comprising: a shell comprising a heat resistant material, the shell shaped to fit on a top of one or more bus bars, wherein the one or more bus bars are electrically connected to a first relay; and a phase change material, the phase change material comprised within the shell, wherein the phase change material is of a substantially similar shape as a shape of the shell, wherein the heat management device limits and/or reduces a temperature of one or more of the bus bars and relay during a charging of a battery of the vehicle.

The phrases "at least one," "one or more," "or," and "and/or" are open-ended expressions that are both conjunctive and disjunctive in operation. For example, each of the expressions "at least one of A, B and C," "at least one of A, B, or C," "one or more of A, B, and C," "one or more of A, B, or C," "A, B, and/or C," and "A, B, or C" means A alone, B alone, C alone, A and B together, A and C together, B and C together, or A, B and C together.

The term "a" or "an" entity refers to one or more of that entity. As such, the terms "a" (or "an"), "one or more," and "at least one" can be used interchangeably herein. It is also to be noted that the terms "comprising," "including," and "having" can be used interchangeably.

The term "automatic" and variations thereof, as used herein, refers to any process or operation, which is typically continuous or semi-continuous, done without material human input when the process or operation is performed. However, a process or operation can be automatic, even though performance of the process or operation uses material or immaterial human input, if the input is received before performance of the process or operation. Human input is deemed to be material if such input influences how the process or operation will be performed. Human input that consents to the performance of the process or operation is not deemed to be "material."

Aspects of the present disclosure may take the form of an embodiment that is entirely hardware, an embodiment that is entirely software (including firmware, resident software, micro-code, etc.) or an embodiment combining software and hardware aspects that may all generally be referred to herein as a "circuit," "module," or "system." Any combination of one or more computer-readable medium(s) may be utilized. The computer-readable medium may be a computer-readable signal medium or a computer-readable storage medium.

A computer-readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer-readable storage medium may be any tangible medium that can contain or store a program for use by or in connection with an instruction execution system, apparatus, or device.

A computer-readable signal medium may include a propagated data signal with computer-readable program code embodied therein, for example, in baseband or as part of a carrier wave. Such a propagated signal may take any of a variety of forms, including, but not limited to, electro-magnetic, optical, or any suitable combination thereof. A computer-readable signal medium may be any computer-readable medium that is not a computer-readable storage medium and that can communicate, propagate, or transport a program for use by or in connection with an instruction execution system, apparatus, or device. Program code embodied on a computer-readable medium may be transmitted using any appropriate medium, including, but not limited to, wireless, wireline, optical fiber cable, RF, etc., or any suitable combination of the foregoing.

The terms "determine," "calculate," "compute," and variations thereof, as used herein, are used interchangeably and include any type of methodology, process, mathematical operation or technique.

What is claimed is:

1. A junction box of a vehicle, the junction box comprising:
    one or more relays;
    one or more bus bars connected to one or more of the one or more relays;
    one or more terminals that interconnect with a battery of the vehicle and one of the one or more relays; and
    one or more phase change materials contained in one or more malleable plastic containers, wherein the one or more malleable plastic containers are attached to at least one of the relays, bus bars, and/or terminals, wherein the one or more phase change materials limit heat generation during a charging of a battery of the vehicle.

2. The junction box of claim 1, the junction box further comprising a thermoelectric device.

3. The junction box of claim 1, wherein a first one of the one or more malleable plastic containers comprises a shell comprising indentations capable of fitting over contact points of a first of the one or more relays.

4. The junction box of claim 1, wherein each one of one or more malleable plastic containers contains a separate one of the one or more phase change materials.

5. The junction box of claim 1, wherein a first terminal of the one or more terminals connects to a current sensor.

6. The junction box of claim 1, wherein the one or more phase change materials have a melting temperature, wherein the melting temperature corresponds to a maximum temperature of the one or more relays.

7. The junction box of claim 1, wherein a first one of the one or more malleable plastic containers comprises a shell.

8. The junction box of claim 7, wherein the shell is shaped to fit one or more contacts of a first relay of the one or more relays.

9. The junction box of claim 7, wherein the first phase change material comprises a form similar to a form of the shell.

10. The junction box of claim 7, wherein the shell is shaped to fit two contacts of a first relay of the one or more relays and portions of two bus bars of the one or more bus bars.

11. The junction box of claim 1, wherein the one or more phase change materials comprise an amount corresponding to a duration of the charging of the vehicle.

12. The junction box of claim 1, wherein the junction box further comprises a current sensor.

13. The junction box of claim 1, wherein each one of the one or more relays is associated with a separate one of the one or more phase change materials.

14. A process of preparing a heat-control system for controlling heat of a junction box during charging, the process comprising:
    providing a malleable plastic container comprising a shell, wherein the shell is formed to make contact with one or more bus bars and one or more contacts of a relay;
    filling the shell with one or more phase change materials; and
    fitting the shell onto one or more of the one or more bus bars and/or the one or more contacts of the relay, wherein the one or more phase change materials limits heat generation during a charging of a battery of a vehicle.

15. The process of claim 14, further comprising providing a thermoelectric device.

16. The process of claim 14, wherein the one or more phase change materials have a melting temperature, wherein the melting temperature corresponds to a maximum temperature of the relay.

17. The process of claim 14, wherein the one or more phase change materials comprise a form similar to a form of the shell.

18. The process of claim 14, wherein the shell is shaped to fit the one or more contacts of the relay and portions of two bus bars of the one or more bus bars.

19. The process of claim 14, wherein the one or more phase change materials comprise an amount corresponding to a duration of a charging of the vehicle.

20. A heat management device, the device comprising:
    a malleable plastic container comprising a shell, the shell comprising a heat resistant material, the shell shaped to fit on a top of one or more bus bars, wherein the one or more bus bars are electrically connected to a first relay; and
    a phase change material, the phase change material comprised within the shell, wherein the phase change material is of a substantially similar shape as a shape of the shell, wherein the heat management device limits and/or reduces a temperature of one or more of the one or more bus bars and first relay during a charging of a battery of a vehicle.

* * * * *